(12) United States Patent
Harvey

(10) Patent No.: US 8,897,463 B2
(45) Date of Patent: Nov. 25, 2014

(54) DUAL HIGH FREQUENCY DRIVER CANALPHONE SYSTEM

(76) Inventor: Jerry Harvey, Apopka, FL (US)

(*) Notice: Subject to any disclaimer, the term of this patent is extended or adjusted under 35 U.S.C. 154(b) by 806 days.

(21) Appl. No.: 12/788,120

(22) Filed: May 26, 2010

(65) Prior Publication Data
US 2011/0293112 A1 Dec. 1, 2011

(51) Int. Cl.
H03G 5/00 (2006.01)
H04R 1/26 (2006.01)
H04R 1/10 (2006.01)

(52) U.S. Cl.
CPC ............... *H04R 1/1016* (2013.01); *H04R 1/26* (2013.01)
USPC ............. 381/99; 381/98; 381/380; 381/322; 381/328; 381/23.1; 381/74; 381/184; 381/312; 381/370; 381/317; 381/151; 381/71.6; 381/71.4; 455/575.1; 455/575.2; 455/344

(58) Field of Classification Search
USPC ............ 381/98, 380, 322, 328, 23.1, 74, 184, 381/312, 370, 317, 151, 71.6, 7, 1.4; 455/575.1, 575.2, 344
See application file for complete search history.

(56) References Cited

U.S. PATENT DOCUMENTS

| | | | | |
|---|---|---|---|---|
| 4,315,102 A * | 2/1982 | Eberbach | ............... | 381/59 |
| 4,742,887 A * | 5/1988 | Yamagishi | ............... | 181/129 |
| 7,194,102 B2 | 3/2007 | Harvey | | |
| 7,194,103 B2 | 3/2007 | Harvey | | |
| 7,263,195 B2 | 8/2007 | Harvey | | |
| 7,317,806 B2 * | 1/2008 | Harvey et al. | ............... | 381/328 |
| 7,489,794 B2 | 2/2009 | Harvey | | |
| 7,634,099 B2 | 12/2009 | Harvey | | |
| 7,672,469 B2 | 3/2010 | Harvey et al. | | |
| 8,116,502 B2 * | 2/2012 | Saggio et al. | ............... | 381/380 |
| 8,391,535 B1 * | 3/2013 | Harvey et al. | ............... | 381/380 |
| 2005/0207607 A1 * | 9/2005 | Yang | ............... | 381/382 |
| 2006/0008110 A1 * | 1/2006 | van Halteren | ............... | 381/417 |
| 2006/0133629 A1 | 6/2006 | Harvey | | |
| 2006/0133630 A1 | 6/2006 | Harvey | | |
| 2006/0133631 A1 | 6/2006 | Harvey | | |
| 2006/0133632 A1 | 6/2006 | Harvey et al. | | |
| 2006/0133636 A1 | 6/2006 | Harvey | | |
| 2006/0193479 A1 | 8/2006 | Harvey | | |
| 2006/0193480 A1 | 8/2006 | Harvey | | |
| 2006/0193481 A1 | 8/2006 | Harvey | | |
| 2006/0193482 A1 | 8/2006 | Harvey | | |
| 2006/0222185 A1 | 10/2006 | Harvey et al. | | |
| 2007/0036385 A1 | 2/2007 | Harvey | | |
| 2007/0053540 A1 | 3/2007 | Harvey | | |
| 2007/0201717 A1 | 8/2007 | Harvey et al. | | |
| 2007/0223735 A1 * | 9/2007 | LoPresti et al. | ............... | 381/99 |

(Continued)

OTHER PUBLICATIONS

ProSoundWeb.com, Stick it in Your Ear, 2004.*

(Continued)

*Primary Examiner* — Davetta W Goins
*Assistant Examiner* — Kuassi Ganmavo
(74) *Attorney, Agent, or Firm* — Douglas J Visnius

(57) ABSTRACT

A canalphone system may include a canalphone housing, and a first high frequency driver carried within the canalphone housing. The system may also include a second high frequency driver carried within the canalphone housing where the second high frequency driver is tuned with the first high frequency driver to deliver lower distortion than a standard canalphone high frequency driver and/or lower distortion than two standard canalphone high frequency drivers that are not tuned with each other.

16 Claims, 3 Drawing Sheets

(56) References Cited

U.S. PATENT DOCUMENTS

2008/0019555 A1\* 1/2008 Llamas-Young ............ 381/380
2008/0181443 A1   7/2008 Harvey
2009/0041262 A1   2/2009 Harvey
2009/0060245 A1\* 3/2009 Blanchard et al. ............ 381/345
2011/0058702 A1\* 3/2011 Saggio, Jr. .................... 381/380

OTHER PUBLICATIONS

Head-Fi.org, Headphones with multiples drivers, Apr. 13, 2010.\*
Patel, Ultimate Ears 18 Pro headphones feature six drivers per ear, Jan. 2010.\*
Willett, Design challenges for compact headphones, 2004.\*

\* cited by examiner

DUAL HIGH FREQUENCY DRIVER CANALPHONE SYSTEM

BACKGROUND OF THE INVENTION

1. Field of the Invention

The invention relates to the field of canalphones, and, more particularly, to lowering distortion in such.

2. Description of Background

There are many different types of personal listening devices such as headphones, earbuds, canalphones, and/or the like. Headphones are personal listening devices that are held in close proximately to the ear by some support system. Earbuds are small personal listening devices that are positioned directly in front of the ear canal and are substantially smaller than a person's outer ear. Similarly, canalphones are personal listening devices that are substantially smaller than a person's outer ear, but they differ from earbuds in that they are placed directly in one end of the ear canal. Both earbuds and canalphones are held in positioned by friction between the ear and the device rather than the support system found in most headphones.

Canalphones are also referred to as in-ear monitors due to how the canalphone is worn by a listener. Some canalphones also serve as earplugs due to the way the canalphone limits noise external to the canalphone from entering the ear canal.

SUMMARY OF THE INVENTION

According to one embodiment of the invention, a canalphone system may include a canalphone housing, and a first high frequency driver carried within the canalphone housing. The system may also include a second high frequency driver carried within the canalphone housing where the second high frequency driver tuned with the first high frequency driver to deliver lower distortion than a standard canalphone high frequency driver and/or lower distortion than two standard canalphone high frequency drivers that are not tuned with each other. The first high frequency driver and second high frequency driver may each comprise balanced armatures.

The system may also include a first low frequency driver carried within the canalphone housing, a second low frequency driver carried within the canalphone housing, a first midrange frequency driver carried within the canalphone housing, and a second midrange frequency driver carried within the canalphone housing. The system may further include a first sound tube connecting the first low frequency driver, the second low frequency driver, the first midrange frequency driver, and the second midrange frequency driver, and the first sound tube connects to an outlet on the canalphone housing. The system may additionally include a second sound tube connecting the first high frequency driver and the second high frequency driver with the outlet.

The first high frequency driver and the second high frequency driver may produce distinguishable frequencies to a person using the system comprising 12,000 hertz to 18,000 hertz. The first high frequency driver and second high frequency driver may be positioned where the oscillation of one interacts with the oscillation of the other to reduce harmonic distortion.

The first high frequency driver's and the second high frequency driver's combined mass may be substantially lighter than a standard canalphone high frequency driver's mass thereby increasing each of the first and second high frequency drivers' transient response when compared to the standard canalphone high frequency driver's transient response. The lighter combined mass of the first high frequency driver and second high frequency driver may reduce power requirements for the system when compared to the standard canalphone high frequency driver's mass.

The first high frequency driver and second high frequency driver may be externally damped by a damper within the canalphone housing. The first high frequency driver and the second high frequency driver may be tuned by the length of the second sound tube, the external damper, and/or the positioning of each high frequency driver with respect to the other high frequency driver.

The system may also include a first crossover carried within the canalphone housing connecting the first low frequency driver and the second low frequency driver with a low frequency portion of an input signal. The system may further include a second crossover carried within the canalphone housing connecting the first midrange frequency driver and the second midrange frequency driver with a midrange frequency portion of the input signal. The system may additionally include a third crossover carried within the canalphone housing connecting the first high frequency driver and the second high frequency driver with a high frequency portion of the input signal.

In one embodiment, the system may include a canalphone housing, and a first high frequency driver carried within the canalphone housing. The system may also include a second high frequency driver carried within the canalphone housing, the first high frequency driver's and second high frequency driver's combined mass being substantially lighter than a standard canalphone high frequency driver's mass thereby increasing each of the first and second high frequency drivers' transient response when compared to the standard canalphone high frequency driver, and the second high frequency driver positioned where its oscillation interacts with the oscillation of the first high frequency driver to deliver at least one of lower distortion than a standard canalphone high frequency driver and lower distortion than two standard canalphone high frequency drivers that are not tuned with each other.

In another embodiment, the system may include a canalphone housing, and a first high frequency driver carried within the canalphone housing. The system may further include a second high frequency driver carried within the canalphone housing, the second high frequency driver tuned with the first high frequency driver to deliver at least one of lower distortion than a standard canalphone high frequency driver and lower distortion than two standard canalphone high frequency drivers that are not tuned with each other. The system may additionally include a first low frequency driver carried within the canalphone housing, a second low frequency driver carried within the canalphone housing, a first midrange frequency driver carried within the canalphone housing, and a second midrange frequency driver carried within the canalphone housing. The system may additionally include a first sound tube connecting the first low frequency driver, the second low frequency driver, the first midrange frequency driver, and the second midrange frequency driver, and the first sound tube connecting to an outlet on the canalphone housing. The system may also include a second sound tube connecting the first high frequency driver and the second high frequency driver with the outlet. The system may further include a first crossover carried within the canalphone housing connecting the first low frequency driver and the second low frequency driver with a low frequency portion of an input signal, a second crossover carried within the canalphone housing connecting the first midrange frequency driver and the second midrange frequency driver with a midrange frequency portion of the input signal, and a third crossover carried within the canalphone housing connecting the first high frequency driver and the second high frequency driver with a high frequency portion of the input signal.

DETAILED DESCRIPTION OF THE INVENTION

The invention will now be described more fully hereinafter with reference to the accompanying drawings, in which preferred embodiments of the invention are shown. Like numbers refer to like elements throughout, like numbers with letter suffixes are used to identify similar parts in a single embodiment, and prime notations are used to indicate similar elements in alternative embodiments.

Figure 1:
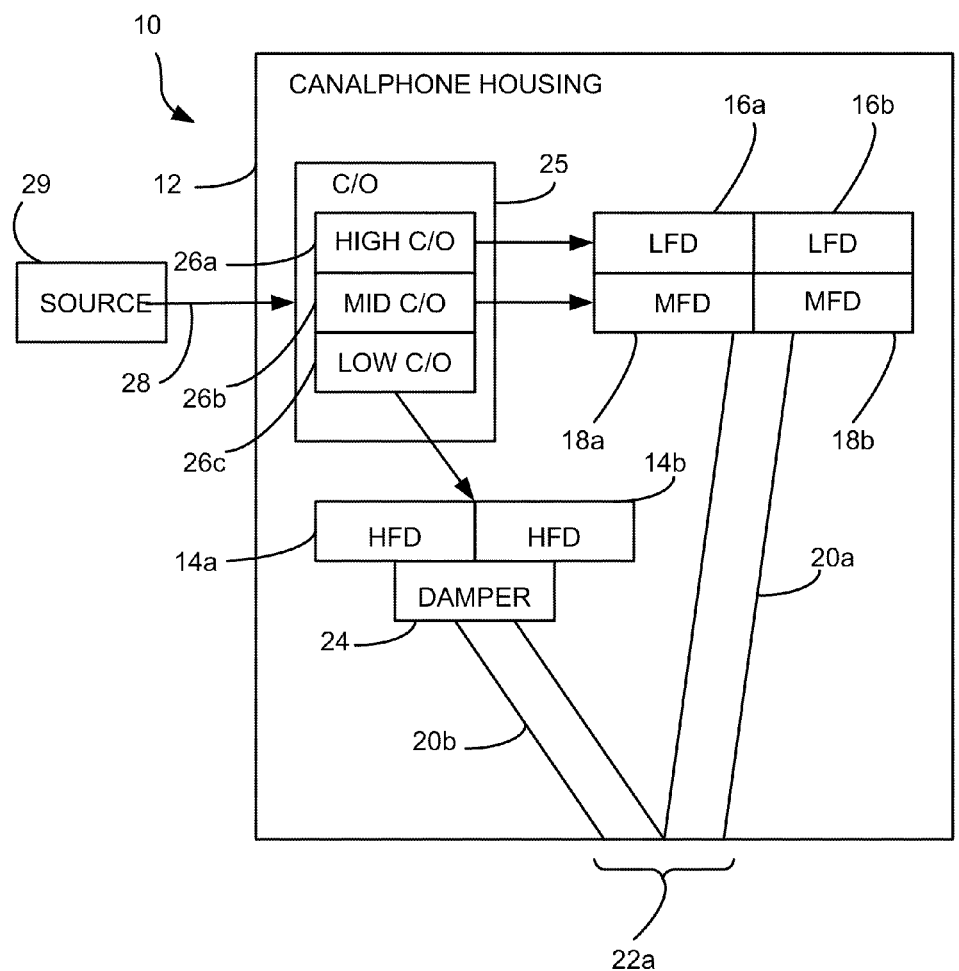
FIG. 1 is a schematic block diagram of a system in accordance with the invention.
Figure 2:
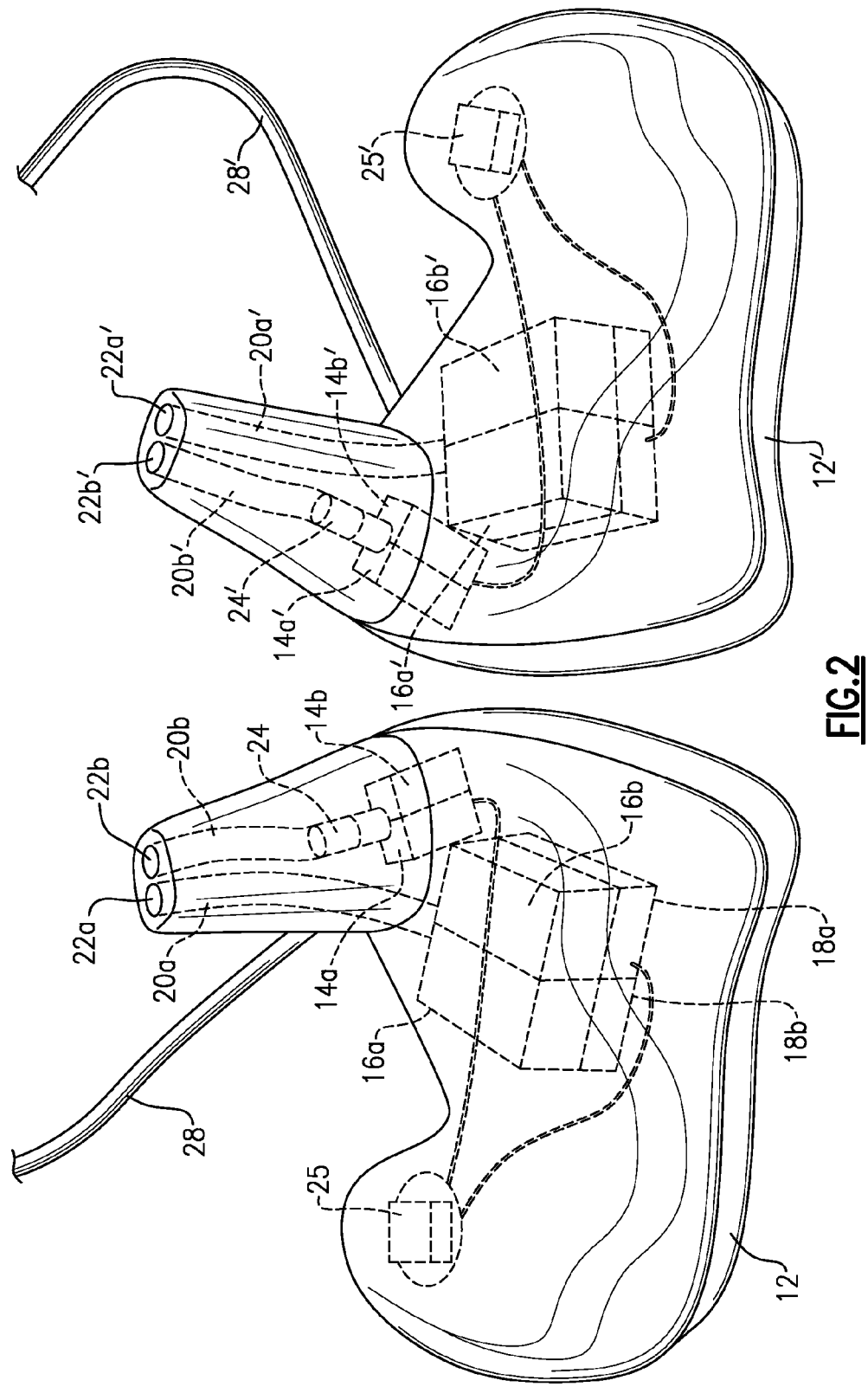
FIG. 2 is an illustration of the system in FIG. 1.
Figure 3:
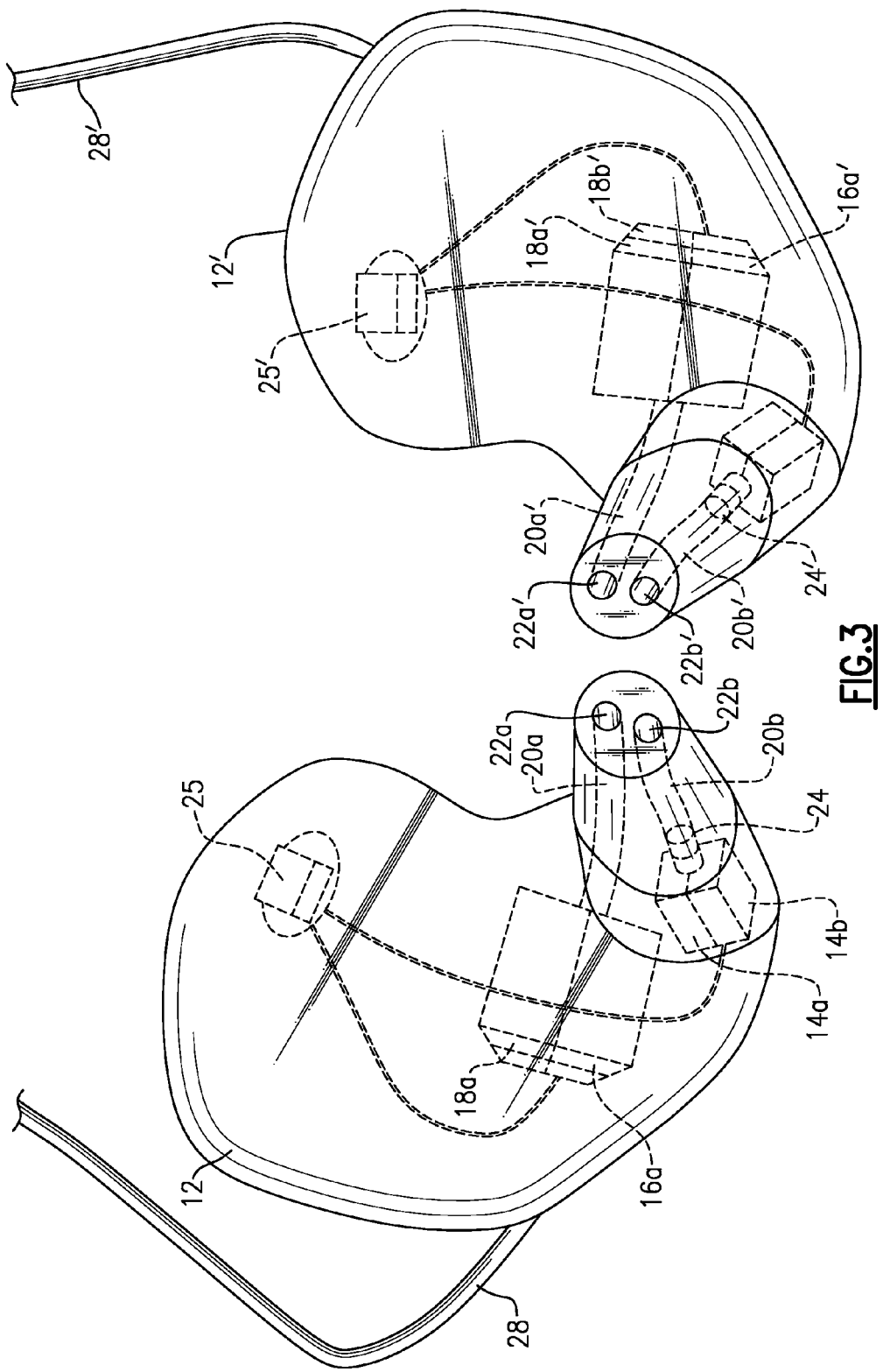
FIG. 3 is an alternative view of the illustration in FIG. 2.

With reference now to FIGS. 1, 2, and 3, a lower distortion canalphone system 10 is initially described. The system 10 includes a canalphone housing 12 that frictionally engages the ear of a user (not shown) in its usage position as will be appreciated by those of skill in the art.

The system 10 also includes a first high frequency driver 14a carried within the canalphone housing 12. The system 10 also includes a second high frequency driver 14b carried within the canalphone housing 12, and the second high frequency driver is tuned with the first high frequency driver 14a to deliver lower distortion than a standard canalphone high frequency driver and/or lower distortion than two standard canalphone high frequency drivers that are not tuned with each other. In other words, the first high frequency driver 14a and the second high frequency driver 14b are tuned, e.g. interact, together to reduce distortion of an output signal rendered electroacoustically by the pair of high frequency drivers 14a and 14b, for example.

In one embodiment, the system 10 also includes a first low frequency driver 16a carried within the canalphone housing 12, a second low frequency driver 16b carried within the canalphone housing, a first midrange frequency driver 18a carried within the canalphone housing, and a second midrange frequency driver 18b carried within the canalphone housing. In another embodiment, the system 10 further includes a first sound tube 20a connecting the first low frequency driver 16a, the second low frequency driver 16b, the first midrange frequency driver 18a, and the second midrange frequency driver 18b. The first sound tube 20a connects to an outlet 22a on the canalphone housing 12.

In one embodiment, the system 10 additionally includes a second sound tube 20b connecting the first high frequency driver 14a and the second high frequency driver 14b with the outlet 22a. In another embodiment, the second sound tube 20b connects the first high frequency driver 14a and the second high frequency driver 14b with a second outlet 22b.

In one embodiment, the first high frequency driver 14a and the second high frequency driver 14b produce distinguishable frequencies to a person using the system comprising 12,000 hertz to 18,000 hertz. Stated another way, a standard high frequency driver in a canalphone is one that can reproduce sound up to 12,000 hertz range. In contrast, system 10 extends this range from 12,000 hertz to 18,000 hertz, which the prior art cannot do. The system 10 accomplishes the foregoing in one embodiment by having the first high frequency driver 14a and second high frequency driver 14b each comprising balanced armatures. In another embodiment, the first high frequency driver 14a and second high frequency driver 14b each comprise other types of transducers such as orthodynamic, electrostatic, Heil air motion transformers, piezoelectric film, electrets, and/or the like.

In another embodiment, the system 10 accomplishes providing the distinguishable frequencies to a person using the system comprising 12,000 hertz to 18,000 hertz by positioning the first high frequency driver 14a and second high frequency driver 14b where the oscillation of one interacts with the oscillation of the other to reduce harmonic distortion.

In another embodiment, the system 10 accomplishes providing the distinguishable frequencies to a person using the system comprising 12,000 hertz to 18,000 hertz by having the first high frequency driver's 14a and second high frequency driver's 14b combined mass be substantially lighter than a standard canalphone high frequency driver's mass. As a result of the reduced mass of each driver 14a and 14b, each of, and/or combined, first and second driver's transient response is increased (more responsive) when compared to a standard canalphone high frequency driver's transient response. In addition, the combined lighter mass of the first high frequency driver 14a and second high frequency driver 14b reduces the power requirements for the system 10 when compared to the standard canalphone high frequency driver's power requirements.

In one embodiment, the first high frequency driver 14a and second high frequency driver 14b are externally damped by a damper 24 within the canalphone housing 12. The damper 24 is passive and/or mechanical, for example. In another embodiment, the first high frequency driver 14a and the second high frequency driver 14b are tuned by the length of the second sound tube 20b, the external damper 24, and/or the positioning of each high frequency driver with respect to the other high frequency driver.

In one embodiment, the system 10 includes a crossover 25 carried by the canalphone housing 12. In another embodiment, the first crossover 26a is carried within the crossover 25 and connects the first low frequency driver 16a and the second low frequency driver 16b with a low frequency portion of an input signal 28 from a source 29. In another embodiment, the system 10 further includes a second crossover 26b carried within the crossover 25 and connects the first midrange frequency driver 18a and the second midrange frequency driver 18b with a midrange frequency portion of the input signal 28. In another embodiment, the system 10 additionally includes a third crossover 26c carried within the crossover 25 and connects the first high frequency driver 14a and the second high frequency driver 14b with a high frequency portion of the input signal 28.

In one embodiment, the system 10 includes a canalphone housing 12, and a first high frequency driver 14a carried within the canalphone housing. The system 10 also includes a second high frequency driver 14b carried within the canalphone housing 12, and where the first high frequency driver's 14a and second high frequency driver's 14b combined mass is substantially lighter than a standard canalphone high frequency driver's mass thereby increasing each of the first and second high frequency drivers' 14a 14b transient response when compared to the standard high frequency driver transient response. The system 10 further includes the second high frequency driver 14b being positioned where its oscillation interacts with the oscillation of the first high frequency driver 14a to deliver at least one of lower distortion than a standard canalphone high frequency driver and lower distortion than two standard canalphone high frequency drivers that do not interact with each other.

In another embodiment, the system includes a canalphone housing 12, and a first high frequency driver 14a carried within the canalphone housing. The system further includes a second high frequency driver 14b carried within the canalphone housing where the second high frequency driver is tuned with the first high frequency driver 14a to deliver at least one of lower distortion than a standard canalphone high frequency driver and lower distortion than two standard canalphone high frequency drivers that are not tuned with each other. The system additionally includes a first low frequency driver 14a carried within the canalphone housing 12, a second low frequency driver 14b carried within the canalphone housing, a first midrange frequency driver 18a carried within the canalphone housing, and a second midrange frequency driver 18b carried within the canalphone housing. The system also includes a first sound tube 20a connecting the first low frequency driver 16a, the second low frequency driver 16b, the first midrange frequency driver 18a, and the second midrange frequency driver 18b, and where the first sound tube connects to an outlet 20a on the canalphone housing 12. The system further includes a second sound tube 20b connecting the first high frequency driver 14a and the second high frequency driver 14b with the outlet 20a. The system additionally includes a first crossover 26a carried within the canalphone housing 12 connecting the first low frequency driver 16a and the second low frequency driver 16b with a low frequency portion of an input signal 28, a second crossover 26b carried within the canalphone housing 12 connecting the first midrange frequency driver 18a and the second midrange frequency driver 18b with a midrange frequency portion of the input signal 28, and a third crossover 26c carried within the canalphone housing 12 connecting the first high frequency driver 14a and the second high frequency driver 14b with a high frequency portion of the input signal 28.

Since a canalphone housing is very small, it is very difficult to achieve any of the preceding embodiments. It is also very difficult to produce superior sound quality such as providing distinguishable frequencies comprising 12,000 hertz to 18,000 hertz to a person using the system because there is very little usable real estate in the canalphone in which to provide additional components. In addition, more components generally mean more power consumption. However, system 10 overcomes the technical hurdles of providing more components in less space, providing superior sound reproduction, and a reduction in power usage than a standard canalphone system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   a canalphone housing;
   a first low frequency driver carried within the canalphone housing;
   a second low frequency driver carried within the canalphone housing;
   a first midrange frequency driver carried within the canalphone housing;
   a second low frequency driver carried within the canalphone housing;
   a second midrange frequency driver carried within the canalphone housing;
   a first high frequency driver carried within the canalphone housing; and
   a second high frequency driver carried within the canalphone housing, the first high frequency driver and the second high frequency driver each produce similar frequencies, the first high frequency driver and second high frequency driver are positioned where the oscillation of one interacts with the oscillation of the other to reduce harmonic distortion, and the first high frequency driver and the second high frequency driver produce distinguishable frequencies to a person using the system comprising 12,000 hertz to 18,000 hertz.

2. The system of claim 1 further comprising:
   a first sound tube connecting the first low frequency driver, the second low frequency driver, the first midrange frequency driver, and the second midrange frequency driver, the first sound tube connecting to an outlet on the canalphone housing; and a second sound tube connecting the first high frequency driver and the second high frequency driver with the outlet.

3. The system of claim 2 wherein the first high frequency driver and second high frequency driver are externally damped by an external damper within the canalphone housing.

4. The claim 3 wherein the first high frequency driver and the second high frequency driver are tuned by at least one of the length of the second sound tube, the external damper, and the positioning of each high frequency driver with respect to the other high frequency driver.

5. The system of claim 1 wherein the first high frequency driver's and second high frequency driver's combined mass is designed lighter thereby increasing each of the first and second high frequency drivers' transient response.

6. The system of claim 5 wherein the lighter mass of the combined first high frequency driver and second high frequency driver provides reduced power requirements for the system.

7. The system of claim 1 wherein the first high frequency driver and second high frequency driver each comprise balanced armatures.

8. The system of claim 1 further comprising:
   a first crossover carried within the canalphone housing connecting the first low frequency driver and the second low frequency driver with a low frequency portion of an input signal;
   a second crossover carried within the canalphone housing connecting the first midrange frequency driver and the second midrange frequency driver with a midrange frequency portion of the input signal; and
   a third crossover carried within the canalphone housing connecting the first high frequency driver and the second high frequency driver with a high frequency portion of the input signal.

9. A system comprising:
   a canalphone housing;
   a first low frequency driver carried within the canalphone housing;
   a second low frequency driver carried within the canalphone housing;
   a first midrange frequency driver carried within the canalphone housing;

a second midrange frequency driver carried within the canalphone housing;

a first high frequency driver carried within the canalphone housing; and a second high frequency driver carried within the canalphone housing, the first high frequency driver's and second high frequency driver's combined mass being designed lighter to increase each of the first and second driver's transient response, and the second high frequency driver positioned where its oscillation interacts with the oscillation of the first high frequency driver to deliver lower distortion than two canalphone high frequency drivers that do not interact with each other, and where the first high frequency driver and the second high frequency driver each produce similar frequencies.

10. The system of claim 9 further comprising:

a first sound tube connecting the first low frequency driver, the second low frequency driver, the first midrange frequency driver, and the second midrange frequency driver, the first sound tube connecting to an outlet on the canalphone housing; and a second sound tube connecting the first high frequency driver and the second high frequency driver with the outlet.

11. The system of claim 10 wherein the first high frequency driver and second high frequency driver are externally damped by an external damper within the canalphone housing, and the first high frequency driver and the second high frequency driver are tuned by at least one of the length of the second sound tube, the external damper, and the positioning of each high frequency driver with respect to the other high frequency driver.

12. The system of claim 10 further comprising:

a first crossover carried within the canalphone housing connecting the first low frequency driver and the second low frequency driver with a low frequency portion of an input signal;

a second crossover carried within the canalphone housing connecting the first midrange frequency driver and the second midrange frequency driver with a midrange frequency portion of the input signal; and a third crossover carried within the canalphone housing connecting the first high frequency driver and the second high frequency driver with a high frequency portion of the input signal.

13. The system of claim 9 wherein the first high frequency driver and the second high frequency driver produce distinguishable frequencies to a person using the system comprising 12,000 hertz to 18,000 hertz, the lighter combined mass of the first high frequency driver and the second high frequency driver providing reduced power requirements for the system, and the first high frequency driver and second high frequency driver each comprising balanced armatures.

14. A system comprising:

a canalphone housing;

a first high frequency driver carried within the canalphone housing;

a second high frequency driver carried within the canalphone housing, the second high frequency driver tuned with the first high frequency driver to deliver lower distortion than two canalphone high frequency drivers that do not interact with each other, the first high frequency driver and the second high frequency driver produce distinguishable frequencies to a person using the system comprising 12,000 hertz to 18,000 hertz, the first high frequency driver and second high frequency driver are positioned where the oscillation of one interacts with the oscillation of the other to reduce harmonic distortion, and where the first high frequency driver and the second high frequency driver each produce each produce similar frequencies;

a first low frequency driver carried within the canalphone housing;

a second low frequency driver carried within the canalphone housing;

a first midrange frequency driver carried within the canalphone housing;

a second midrange frequency driver carried within the canalphone housing;

a first sound tube connecting the first low frequency driver, the second low frequency driver, the first midrange frequency driver, and the second midrange frequency driver, the first sound tube connecting to an outlet on the canalphone housing;

a second sound tube connecting the first high frequency driver and the second high frequency driver with the outlet;

a first crossover carried within the canalphone housing connecting the first low frequency driver and the second low frequency driver with a low frequency portion of an input signal;

a second crossover carried within the canalphone housing connecting the first midrange frequency driver and the second midrange frequency driver with a midrange frequency portion of the input signal; and a third crossover carried within the canalphone housing connecting the first high frequency driver and the second high frequency driver with a high frequency portion of the input signal.

15. The system of claim 14 wherein the first high frequency driver's and second high frequency driver's combined mass is designed lighter to increase each of the first and second driver's transient response, the lighter mass of the first high frequency driver and second high frequency driver providing reduced power requirements for the system, and the first high frequency driver and second high frequency driver each comprise balanced armatures.

16. The system of claim 14 wherein the first high frequency driver and second high frequency driver are externally damped by an external damper within the canalphone housing, the first high frequency driver and the second high frequency driver are tuned by at least one of the length of the second sound tube, the external damper, and the positioning of each high frequency driver with respect to the other high frequency driver.

\* \* \* \* \*